(12) United States Patent
Wang et al.

(10) Patent No.: US 12,148,696 B2
(45) Date of Patent: Nov. 19, 2024

(54) METHODS FOR REDUCING DUAL DAMASCENE DISTORTION (71) Applicant: Taiwan Semiconductor Manufacturing Co., Ltd., Hsinchu (TW)

(72) Inventors: Chao-Chun Wang, Hsinchu (TW); Chung-Chi Ko, Nantou (TW); Po-Cheng Shih, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 110 days.

(21) Appl. No.: 17/815,381

(22) Filed: Jul. 27, 2022

(65) Prior Publication Data
US 2022/0367355 A1 Nov. 17, 2022

Related U.S. Application Data (63) Continuation of application No. 17/077,556, filed on Oct. 22, 2020, now Pat. No. 11,482,493, which is a
(Continued)

(51) Int. Cl.
*H01L 23/528* (2006.01)
*H01L 21/768* (2006.01)
(Continued)

(52) U.S. Cl.
CPC .... *H01L 23/5283* (2013.01); *H01L 21/76807* (2013.01); *H01L 21/7681* (2013.01); *H01L 21/76835* (2013.01); *H01L 21/76877* (2013.01); *H01L 23/5226* (2013.01); *H01L 23/53238* (2013.01); *H01L 23/5329* (2013.01); *H01L 23/53295* (2013.01)

(58) Field of Classification Search
CPC ........... H01L 23/5283; H01L 21/76807; H01L 21/7681; H01L 21/76835; H01L 21/76877; H01L 23/5226; H01L 23/53238; H01L 23/5329; H01L 23/53295; H01L 21/76829; H01L 21/76897; H01L 21/28568; H01L 21/76802; H01L 21/76805; H01L 21/76843
See application file for complete search history.

(56) References Cited

U.S. PATENT DOCUMENTS 5,741,626 A 4/1998 Jain et al.
8,592,990 B2 11/2013 Chikaki et al.
(Continued)

FOREIGN PATENT DOCUMENTS

CN 102024790 A 4/2011
CN 102770580 A 11/2012
(Continued)

*Primary Examiner* — Farun Lu
(74) *Attorney, Agent, or Firm* — Slater Matsil, LLP (57) ABSTRACT

An integrated circuit structure includes a first low-k dielectric layer having a first k value, and a second low-k dielectric layer having a second k value lower than the first k value. The second low-k dielectric layer is overlying the first low-k dielectric layer. A dual damascene structure includes a via with a portion in the first low-k dielectric layer, and a metal line over and joined to the via. The metal line includes a portion in the second low-k dielectric layer.

20 Claims, 12 Drawing Sheets

Related U.S. Application Data continuation of application No. 16/388,547, filed on Apr. 18, 2019, now Pat. No. 10,818,598, which is a continuation of application No. 15/830,603, filed on Dec. 4, 2017, now Pat. No. 10,332,836, which is a continuation of application No. 14/986,855, filed on Jan. 4, 2016, now Pat. No. 9,842,804.

(51) Int. Cl.
*H01L 23/522* (2006.01)
*H01L 23/532* (2006.01)

(56) References Cited

U.S. PATENT DOCUMENTS

| | | | |
|---|---|---|---|
| 8,652,962 | B2 | 2/2014 | Singh et al. |
| 2005/0101119 | A1 | 5/2005 | Li et al. |
| 2008/0171431 | A1* | 7/2008 | Yu .................. H01L 21/76835 438/618 |
| 2008/0318430 | A1* | 12/2008 | Park .................. H01L 21/76835 257/E21.214 |
| 2011/0147882 | A1* | 6/2011 | Tsutsue ............ H01L 21/02126 257/774 |
| 2011/0206857 | A1 | 8/2011 | Yim et al. |
| 2012/0025395 | A1 | 2/2012 | Chikaki et al. |
| 2013/0260575 | A1 | 10/2013 | Al-Rashid et al. |
| 2016/0111638 | A1 | 4/2016 | Banno et al. |

FOREIGN PATENT DOCUMENTS

| | | |
|---|---|---|
| JP | 2012033588 A | 2/2012 |
| KR | 20050086301 A | 8/2005 |
| KR | 100818108 B1 | 3/2008 |
| KR | 20130142866 A | 12/2013 |
| KR | 20140011908 A | 1/2014 |
| WO | 2014208050 A1 | 12/2014 |

* cited by examiner

METHODS FOR REDUCING DUAL DAMASCENE DISTORTION

PRIORITY CLAIM AND CROSS-REFERENCE

This application is a continuation of U.S. patent application Ser. No. 17/077,556, entitled "Methods for Reducing Dual Damascene Distortion," and filed Oct. 22, 2020, which is a continuation of U.S. patent application Ser. No. 16/388,547, entitled "Methods for Reducing Dual Damascene Distortion," filed on Apr. 18, 2019, now U.S. Pat. No. 10,818,598 issued Oct. 27, 2020, which is a continuation of U.S. patent application Ser. No. 15/830,603, entitled "Methods for Reducing Dual Damascene Distortion," filed on Dec. 4, 2017, now U.S. Pat. No. 10,332,836 issued Jun. 25, 2019, which is a continuation of U.S. patent application Ser. No. 14/986,855, entitled "Methods for Reducing Dual Damascene Distortion," filed on Jan. 4, 2016, now U.S. Pat. No. 9,842,804 issued Dec. 12, 2017, which applications are incorporated herein by reference.

BACKGROUND

Integrated circuit devices such as transistors are formed on semiconductor wafers. The devices are interconnected through metal lines and vias to form functional circuits, wherein the metal lines and vias are formed in back-end-of-line processes. To reduce the parasitic capacitance of the metal lines and vias, the metal lines and vias are formed in low-k dielectric layers.

In the formation of the metal lines and vias in a low-k dielectric layer, the low-k dielectric layer is first etched to form trenches and via openings. The etching of the low-k dielectric layer may involve forming a patterned hard mask over the low-k dielectric material, and using the patterned hard mask as an etching mask to form trenches. Via openings are also formed to substantially aligned to the trenches. The trenches and the via openings are then filled with a metallic material, which may include copper. A Chemical Mechanical Polish (CMP) is then performed to remove excess portions of the metallic material over the low-k dielectric layer. The remaining portions of the metallic material are metal lines and vias.

Conventional vias may suffer from distortion, particularly when the width of the metal lines and vias are very small. For example, the upper portions of the vias that are slightly lower than where vias join the overlying metal lines may suffer from kinks, which are portions that are narrower than both overlying and underlying portions of the respective vias.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Interconnect structures of integrated circuits and the methods of forming the same are provided in accordance with various exemplary embodiments. The intermediate stages of forming the interconnect structures are illustrated. The variations of the embodiments are discussed. Throughout the various views and illustrative embodiments, like reference numbers are used to designate like elements.

FIGS. 1 through 11 illustrate the cross-sectional views of intermediate stages in the formation of interconnect structures of integrated circuits in accordance with some embodiments. The steps shown in FIGS. 1 through 11 are also shown in the process flow 200 in FIG. 12.

Figure 1:
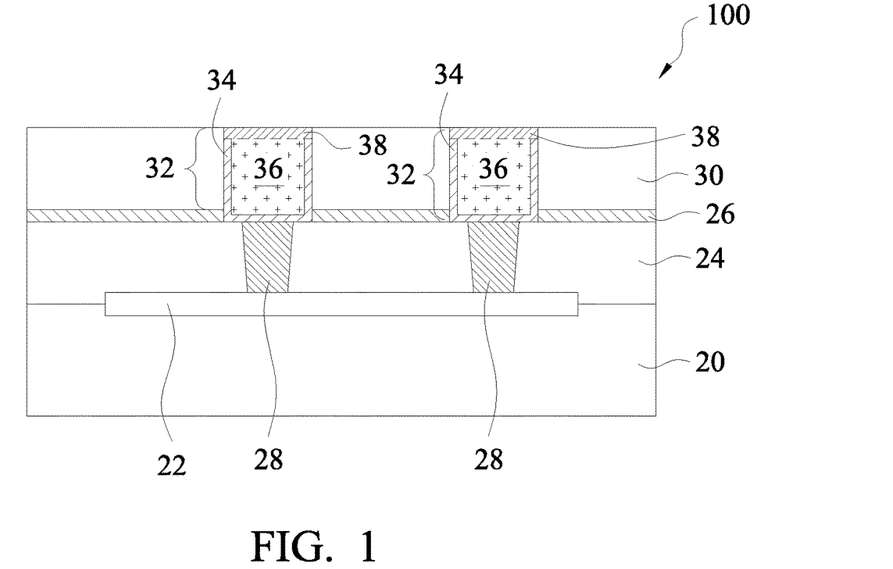
FIGS. 1 through 11 illustrate the cross-sectional views of intermediate stages in the formation of an interconnect structure in accordance with some embodiments.

FIG. 1 illustrates wafer 100, which includes semiconductor substrate 20 and the features formed over semiconductor substrate 20. In accordance with some embodiments of the present disclosure, semiconductor substrate 20 includes crystalline silicon, crystalline germanium, silicon germanium, a III-V compound semiconductor such as GaAsP, AlInAs, AlGaAs, GaInAs, GaInP, GaInAsP, and/or the like. Semiconductor substrate 20 may also be a bulk silicon substrate or a Silicon-On-Insulator (SOI) substrate.

In accordance with some embodiments of the present disclosure, wafer 100 is used to form a device die. In these embodiments, integrated circuit devices 22 are formed on the top surface of semiconductor substrate 20. Exemplary integrated circuit devices 22 may include Complementary Metal-Oxide Semiconductor (CMOS) transistors, resistors, capacitors, diodes, or the like. The details of integrated circuit devices 22 are not illustrated herein. In accordance with alternative embodiments, wafer 100 is used for forming interposers. In these embodiments, no active devices such as transistors and diodes are formed on substrate 20. There may (or may not) be passive devices such as capacitors, resistors, inductors, or the like formed in wafer 100. Substrate 20 may also be a dielectric substrate in the embodiments in which wafer 100 is an interposer wafer. Furthermore, through-vias (not shown) may be formed to penetrate through substrate 20 in order to interconnect the components on the opposite sides of substrate 20.

Inter-Layer Dielectric (ILD) 24 is formed over semiconductor substrate 20 and fills the space between the gate stacks of transistors (not shown) in integrated circuit devices 22. In accordance with some exemplary embodiments, ILD 24 comprises phosphosilicate glass (PSG), borosilicate glass (BSG), boron-doped phosphosilicate glass (BPSG), fluorine-doped silicate glass (FSG), tetraethyl orthosilicate (TEOS), or the like. ILD 24 may be formed using spin coating, Flowable Chemical Vapor Deposition (FCVD), or the like. In accordance with alternative embodiments of the present disclosure, ILD 24 is formed using a deposition method such as Plasma Enhanced Chemical Vapor Deposition (PECVD), Low Pressure Chemical Vapor Deposition (LPCVD), or the like.

As also shown in FIG. 1, etch stop layer 26 is formed over ILD 24 and integrated circuit devices 22, if any. Etch stop layer 26 may comprise silicon carbide, silicon nitride, silicon oxynitride, silicon carbo-nitride, or the like. Etch stop layer 26 is formed of a material that has a high etching selectivity relative to the overlying dielectric layer 30, and hence etch stop layer 26 may be used to stop the etching of dielectric layer 30.

Contact plugs 28 are formed in ILD 24 and are used to electrically connect to integrated circuit devices 22. For example, contact plugs 28 may include gate contact plugs that are connected to the gate electrodes of transistors (not shown) in integrated circuit devices 22 and source/drain contact plugs that are electrically connected to the source/drain regions of the transistors. In accordance with some embodiments of the present disclosure, contact plugs 28 are formed of a material selected from tungsten, aluminum, copper, titanium, tantalum, titanium nitride, tantalum nitride, alloys therefore, and/or multi-layers thereof. The formation of contact plugs 28 may include etching ILD 24 to form contact openings, filling a conductive material(s) into the contact openings until the conductive material fills the entireties of the contact openings, and performing a planarization (such as Chemical Mechanical Polish (CMP)) to level the top surfaces of contact plugs 28 with the top surface of ILD 24.

Further illustrated in FIG. 1 is dielectric layer 30, which is sometimes referred to as Inter-Metal Dielectric (IMD) layer 30 hereinafter. In accordance with some embodiments of the present disclosure, dielectric layer 30 is formed of a low-k dielectric material having a dielectric constant (k-value) lower than about 3.0, about 2.5, or even lower. Dielectric layer 30 may comprise Black Diamond (a registered trademark of Applied Materials), an oxygen-containing and/or carbon containing low-k dielectric material, Hydrogen SilsesQuioxane (HSQ), MethylSilsesQuioxane (MSQ), or the like.

Conductive lines 32 are formed in IMD 30. In accordance with some embodiments, conductive lines 32 include diffusion barrier layers 34 and copper-containing material 36 over diffusion barrier layers 34. Diffusion barrier layers 34 may include titanium, titanium nitride, tantalum, tantalum nitride, or the like, and have the function of preventing copper in copper-containing material 36 from diffusing into IMD 30. Conductive lines 32 are referred to as metal lines 32 hereinafter.

In accordance with some embodiments of the present disclosure, metal caps 38 are formed over metal lines 32. Metal caps 38 may also be considered as parts of metal lines 32 throughout the description. In some embodiments, metal caps 38 include cobalt (Co), CoWP, CoB, tungsten (W), tantalum (Ta), nickel (Ni), molybdenum (Mo), titanium (Ti), iron (Fe), or alloys thereof. Metal caps 38 may be formed selectively using ElectroChemical Plating (ECP) or electroless plating, during which wafer 100 is submerged in a plating solution. In accordance with alternative embodiments of the present disclosure, metal caps 38 are blanket formed on metal lines 32 and dielectric layer 30, followed by an etching process to remove undesirable portions. FIG. 1 illustrates that metal lines 32 are in a bottom metal layer, which is the metal layer immediately over contact plugs 28. The illustrated metal lines 32 may also represent the metal lines in any metal layer that is over the bottom metal layer.

Figure 2:
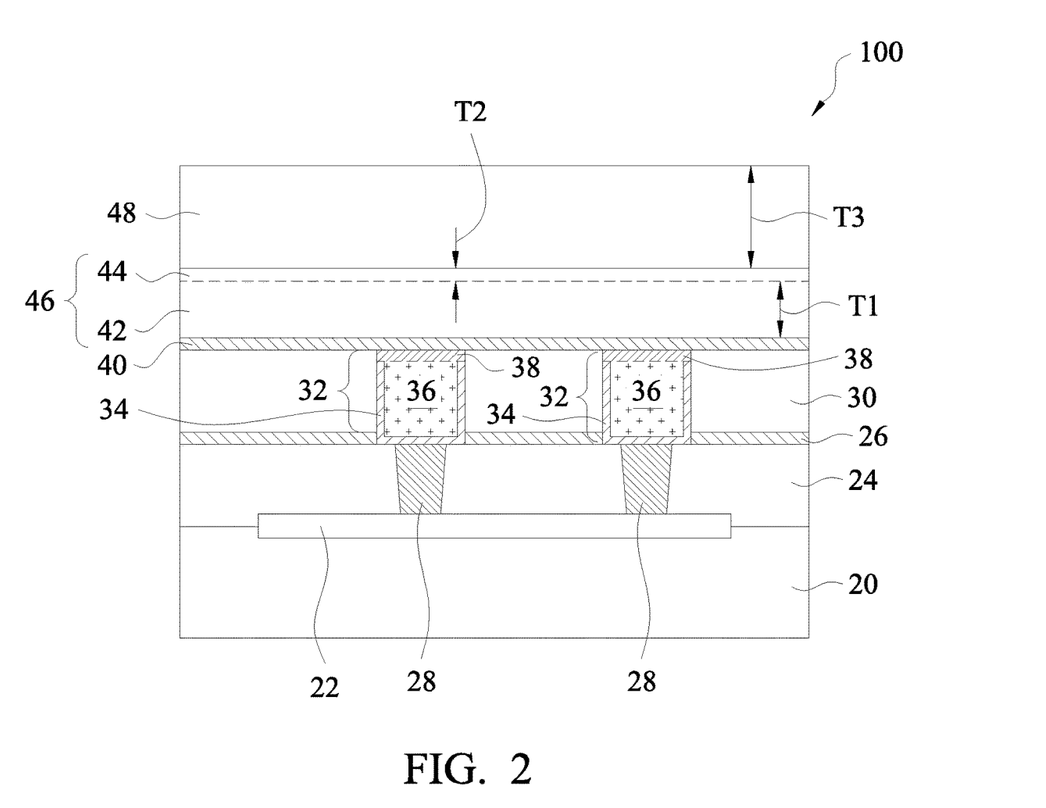

FIGS. 2 through 9 illustrate the cross-sectional views of intermediate stages in a dual damascene process in accordance with some embodiments of the present disclosure. Referring to FIG. 2, etch stop layer 40 and low-k dielectric layers 42, 44, and 48 are formed. In accordance with some embodiments, etch stop layer 40 is formed of silicon carbide, silicon nitride, silicon oxynitride, silicon carbo-nitride, or the like. Etch stop layer 40 is in contact with metal caps 38 and dielectric layer 30.

Low-k dielectric layer 42 is formed over etch stop layer 40. The respective step is shown as step 202 in the process flow shown in FIG. 12. Low-k dielectric layer 42 may be formed of a material that is selected from the same candidate materials for forming dielectric layer 30. For example, low-k dielectric layer 42 may be formed of an oxygen-containing and/or carbon-containing dielectric material, Black Diamond, HSQ, MSQ, or the like. In accordance with some exemplary embodiments, low-k dielectric layer 42 is formed SiCO. An exemplary composition of low-k dielectric layer 42 has an oxygen atomic percentage between about 40 percent and about 50 percent, a carbon atomic percentage between about 10 percent and about 20 percent, and a silicon atomic percentage between about 30 percent and about 40 percent.

Low-k dielectric layer 42 may also have a low dielectric constant (low-k value), which may be between about 2.8 and about 3.5. Thickness T1 of low-k dielectric layer 42 may be in the range between about 300 Å and about 450 Å. It is appreciated that the values recited throughout the description are examples, and may be changed to different values.

Transition low-k dielectric layer 44 is formed over and contacting the top surface of low-k dielectric layer 42. The respective step is shown as step 204 in the process flow shown in FIG. 12. Transition low-k dielectric layer 44 has a k value lower than the k value of low-k dielectric layer 42. The k value of low-k dielectric layer 44 is lower than the k value of low-k dielectric layer 42 by difference Δk, which is more than about 0.1, or higher than about than 0.2. The k value difference Δk may be in the range between about 0.1 and about 0.8. In accordance with some embodiments of the present disclosure, the k value of low-k dielectric layer 44 is between about 2.6 and about 2.8.

Low-k dielectric layer 44 may be formed of a material that is selected from the same candidate materials for forming low-k dielectric layer 42. For example, low-k dielectric layer 42 may be formed of an oxygen-containing and/or carbon-containing dielectric material, Black Diamond, HSQ, MSQ, or the like. In accordance with some exemplary embodiments, low-k dielectric layer 44 is formed SiCO. An exemplary composition of low-k dielectric layer 44 has an oxygen atomic percentage between about 40 percent and about 50 percent, a carbon atomic percentage between about 10 percent and about 16 percent, and a silicon atomic percentage between about 30 percent and about 40 percent. In accordance with some embodiments of the present disclosure, thickness T2 of low-k dielectric layer 44 is in the range between about 30 Å and about 150 Å.

Low-k dielectric layer 48 is formed over and contacting the top surface of transition low-k dielectric layer 44. The respective step is shown as step 206 in the process flow shown in FIG. 12. Low-k dielectric layer 48 has a k value further lower than the k value of transition low-k dielectric layer 44. The k value of low-k dielectric layer 48 is lower than the k value of low-k dielectric layer 44 by difference $\Delta k'$, which is more than about 0.1. The k value difference $\Delta k'$ may be in the range between about 0.1 and about 0.3. In accordance with some embodiments of the present disclosure, the k value of low-k dielectric layer 48 is between about 2.4 and about 2.6.

Low-k dielectric layer 48 may be formed of a material that is selected from the same candidate materials for forming low-k dielectric layer 44. For example, low-k dielectric layer 48 may be formed of an oxygen-containing and/or carbon-containing dielectric material, Black Diamond, HSQ, MSQ, or the like. In accordance with some exemplary embodiments, low-k dielectric layer 48 is also formed SiCO. An exemplary composition of low-k dielectric layer 48 has an oxygen atomic percentage between about 40 percent and about 50 percent, a carbon atomic percentage between about 10 percent and about 15 percent, and a silicon atomic percentage between about 35 percent and about 45 percent. In accordance with some embodiments of the present disclosure, thickness T3 of low-k dielectric layer 48 is in the range between about 300 Å and about 450 Å.

Low-k dielectric layers 42, 44, and 48 have increasingly lower k values. Layers 42 and 44 are also referred to in combination as layer 46, which has a higher k value than low-k dielectric layer 48. Also, low-k dielectric layers 42, 44, and 48 are increasingly porous, with low-k dielectric layer 44 being more porous than low-k dielectric layer 42, and low-k dielectric layer 48 being more porous than low-k dielectric layer 44. With low-k dielectric layer 44 having a k value and a density between the k values and the densities of low-k dielectric layers 42 and 48, low-k dielectric layer 44 is referred to as a transition layer. Having layer 44 to be denser than layer 48 has the effect of reducing the distortion in via, as will be discussed in subsequent paragraphs. Both the k value difference $\Delta k'$ (between the k values of low-k dielectric layer 48 and low-k dielectric layer 44) and thickness T2 of dielectric layer 44 affect the effect of reducing the via distortion. For example, both the k value difference $\Delta k'$ and thickness T2 need to be big enough so that the distortion 82 in via opening 58 (FIG. 7) and the respective via 64 (FIG. 11) can be eliminated. If either one of k value difference $\Delta k'$ and thickness T2 is too small, the effect of reducing via distortion is sacrificed or disappears.

In accordance with some exemplary embodiments, an entirety of low-k dielectric layer 44 has a uniform or substantially uniform k value (for example, with a variation smaller than about 0.05). At the interface between low-k dielectric layer 44 and low-k dielectric layer 42, there is an abrupt change in k values. At the interface between low-k dielectric layer 44 and low-k dielectric layer 48, there is an abrupt change in k values. In accordance with alternative embodiments, low-k dielectric layer 44 has gradually changed values, with the upper portions of low-k dielectric layer 44 having increasingly lower k values than the respective lower portions. The k values of low-k dielectric layer 44 may also be staged to include several sub-layers, with each of the sub-layers having a uniform k value. The upper sub-layers have lower k values than the respective lower sub-layers. In accordance with these embodiments, at the interface between low-k dielectric layer 44 and low-k dielectric layer 42, there may be, or may not be, an abrupt change in k values. At the interface between low-k dielectric layer 44 and low-k dielectric layer 48, there may be, or may not be, an abrupt change in k values. The change in low-k dielectric layer 44 may also be continuous, with no abrupt change of k-value and density between neighboring portions in low-k dielectric layer 44.

In accordance with some embodiments of the present disclosure, the formation of each of low-k dielectric layers 42, 44, and 48 includes depositing a porogen-containing dielectric base material (such as SiOC) and a porogen. The formation of low-k dielectric layers 42, 44, and 48 may be performed in a same process chamber, wherein the precursors for forming the base materials (such as SiOC) of layers 42, 44, and 48 may be similar from each other. For example, the formation of layers 42, 44, and 48 may use same precursors, and the processes for forming layer 42 may be transitioned to the formation of layer 44 (and 48) by adjusting the amount of precursors (such as flow rates) without breaking vacuum of the respective chamber. Layers 42, 44, and 48 may have the same elements (such as Si, O, and C), and the percentages of the elements may be substantially equal to each other (for example, with differences smaller than 5 percent of the respective value). However, the porogen introduced when forming low-k dielectric layer 44 is more than the porogen introduced when forming low-k dielectric layer 42, and the porogen introduced when forming low-k dielectric layer 48 is further more than the porogen introduced when forming low-k dielectric layer 44. To achieve continuously changed k value and porosity in transition layer 44, the precursors may be continuously adjusted with the proceeding of the deposition of layer 44.

By driving out the porogen in layers 42, 44, and 48, the remaining low-k dielectric layers 42, 44, and 48 become porous and have low k values. The porogen in low-k dielectric layers 42, 44, and 48 may be driven out in a same thermal curing process. Alternatively, the formation of each of layers 42, 44, and 48 is followed by a curing process for driving out the porogen. In the resulting structure, the composition of layers 42, 44, and 48 may be essentially the same as each other (or slightly different from each other), except the porosities are different, with layer 48 having the highest porosity, and layer 42 having the lowest porosity.

In accordance with some embodiments, instead of forming low-k dielectric layer 42 and transition layer 44 having different k values, a single low-k dielectric layer 46 is formed, wherein the single low-k dielectric layer 46 is formed at the same location layers 42 and 46 are formed. Low-k dielectric layer 46 is a homogenous material, which has a uniform k value, and has a uniform composition. Alternatively stated, this embodiment may be considered as the transition layer 44 is eliminated, and low-k dielectric layer 42 contacts the overlying low-k dielectric layer 48. The entire low-k dielectric layer 46 may have the properties same as layer 42 in the previous embodiment. For example, an exemplary composition of low-k dielectric layer 46 may include an oxygen atomic percentage between about 40 percent and about 50 percent, a carbon atomic percentage between about 10 percent and about 20 percent, and a silicon atomic percentage between about 30 percent and about 40 percent. Low-k dielectric layer 46 in these embodiments may also have a low-k value, which may be between about 2.8 and about 3.5.

Figure 3:
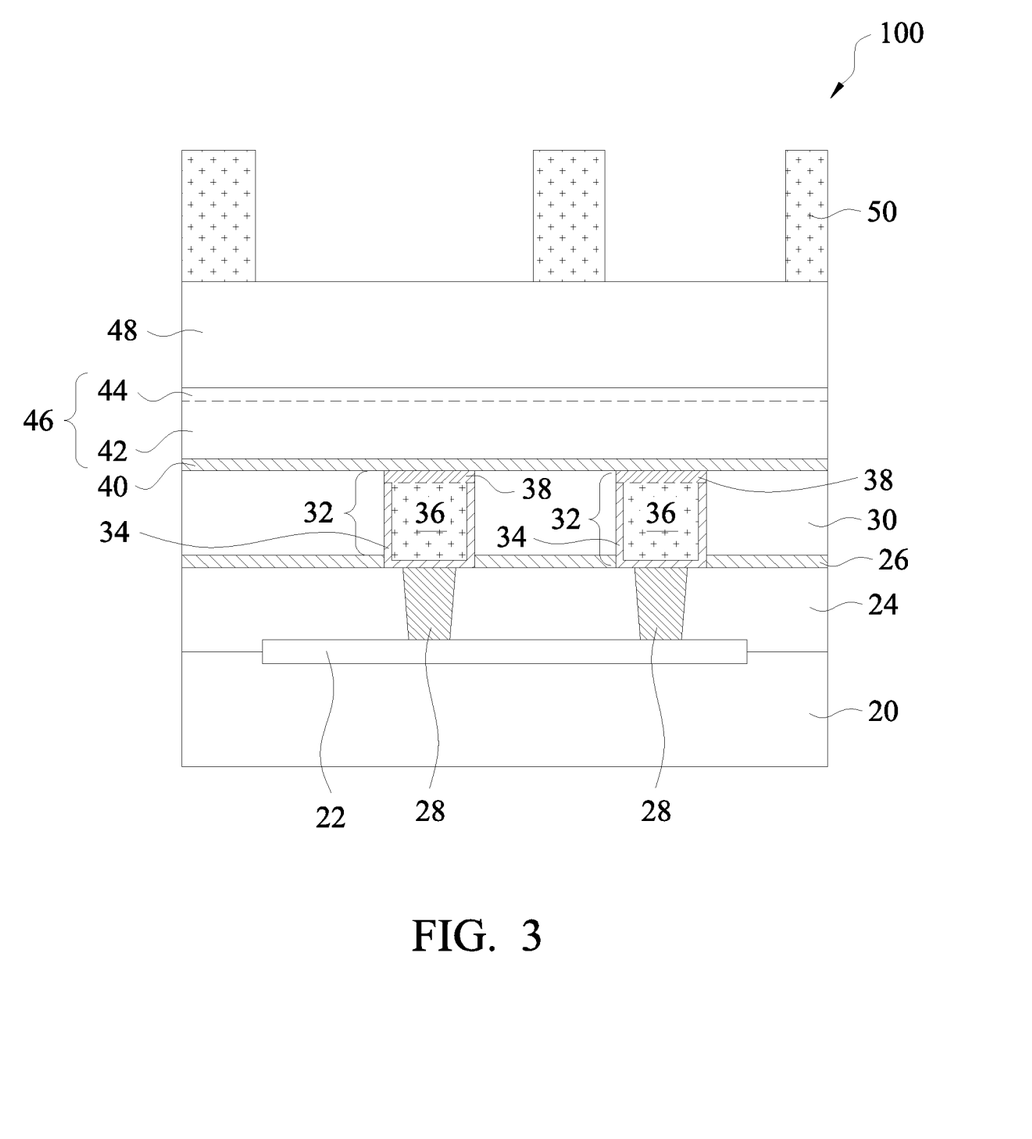
Figure 4:
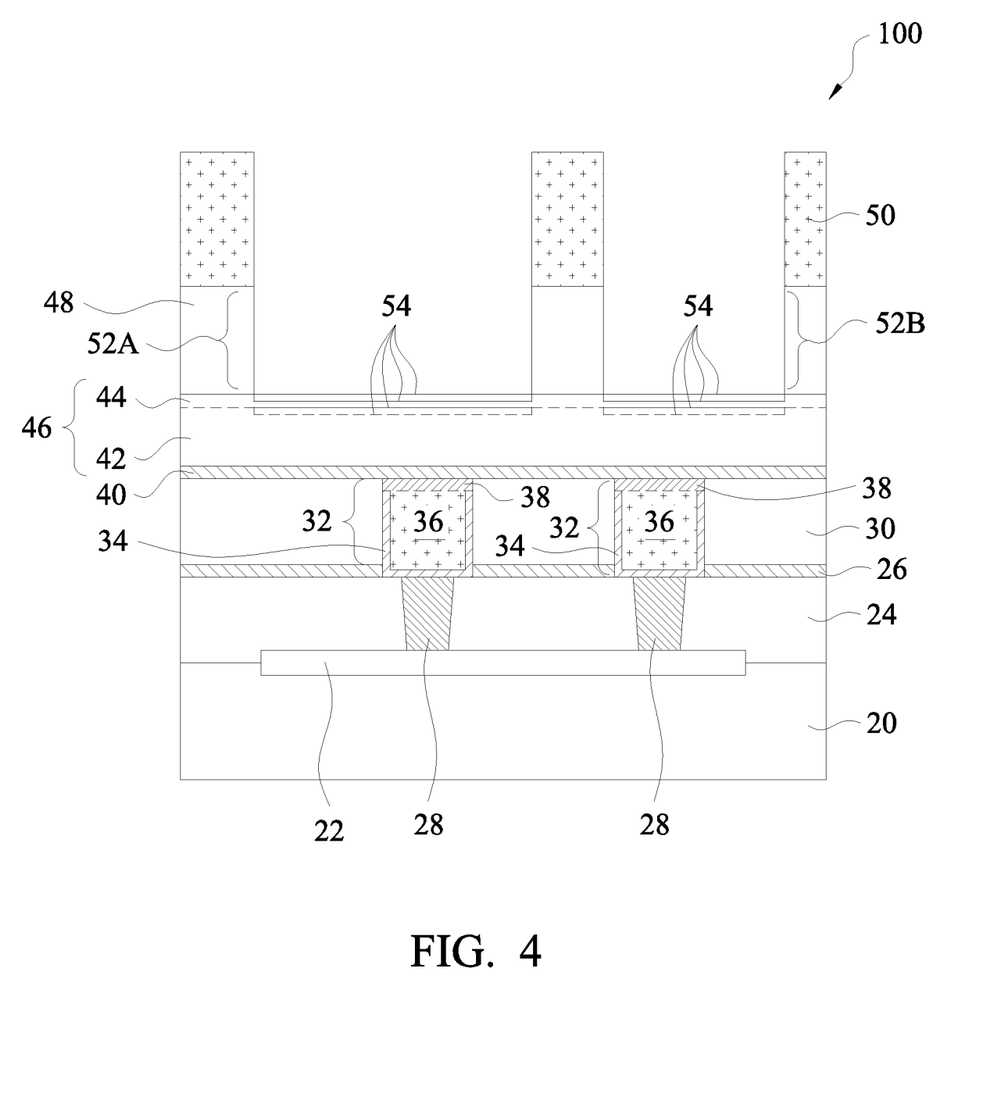

Referring to FIG. 3, photo resist 50 is applied over low-k dielectric layer 48, and is patterned in a lithography process. The respective step is shown as step 208 in the process flow shown in FIG. 12. Next, as shown in FIG. 4, low-k dielectric layer 48 is etched using the patterned photo resist 50 as an etching mask, and hence trenches 52A and 52B are formed. The respective step is shown as step 210 in the process flow shown in FIG. 12. In accordance with some embodiments, the etching is performed using a time mode, so that the etching is controlled to stop on the top surface of low-k dielectric layer 44.

In accordance with some embodiments of the present disclosure, trenches 52A and 52B stop at the top surface of low-k dielectric layer 44. In accordance with alternative embodiments, trenches 52A and 52B extend into low-k dielectric layer 44, and stop at an intermediate level between the top surface and the bottom surface of low-k dielectric layer 44. In accordance with yet alternative embodiments of the present disclosure, trenches 52A and 52B penetrate through low-k dielectric layer 44, and stop at the top surface of, or extend into, low-k dielectric layer 42. Dashed lines 54 schematically illustrate the positions of the bottom surfaces of trenches 52A and 52B in accordance with various embodiments. After the etching, photo resist 50 is removed.

Figure 5:
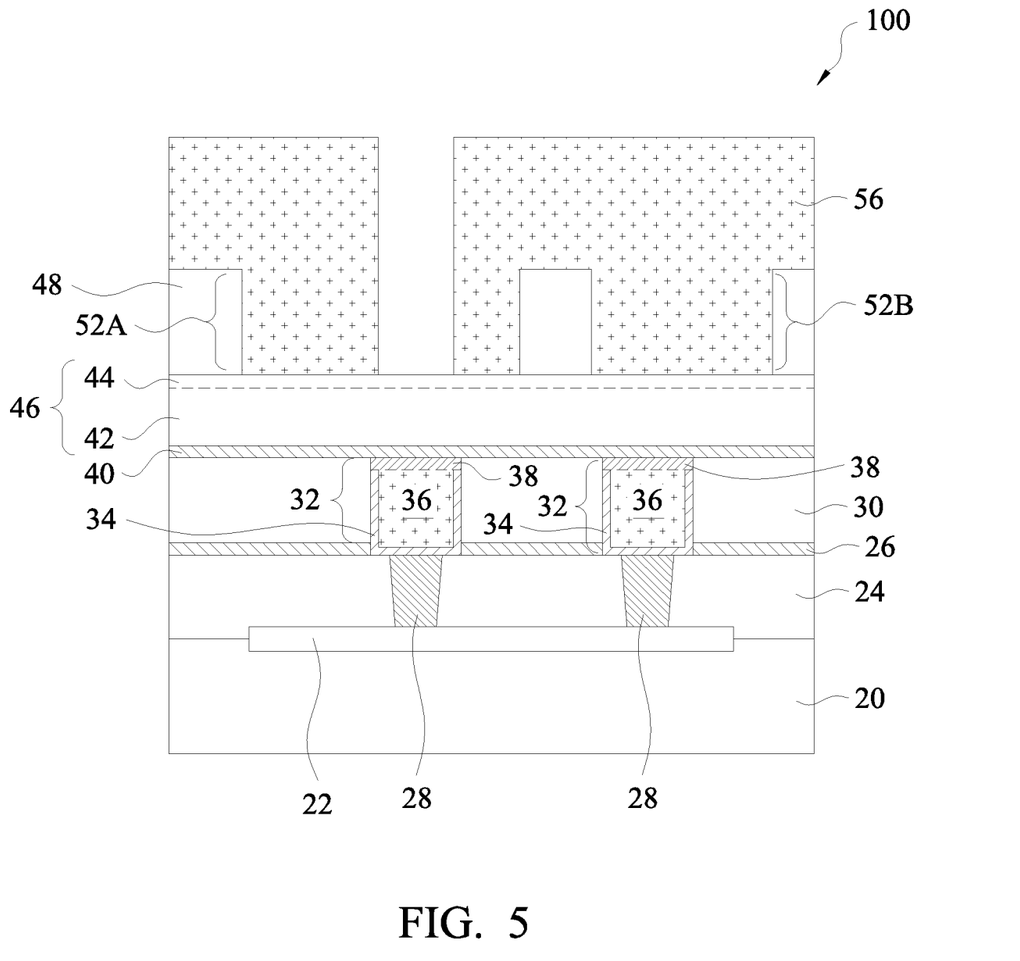
Figure 6:
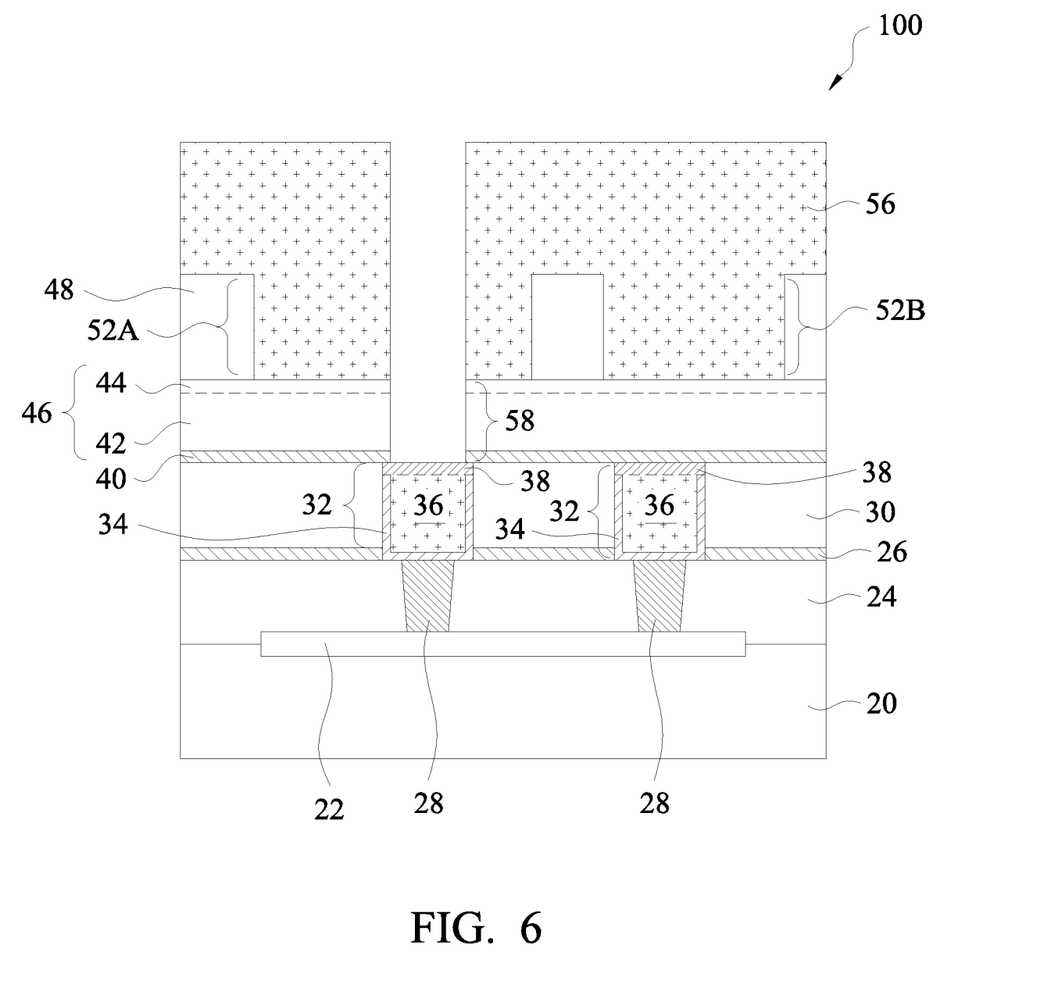

Referring to FIG. 5, photo resist 56 is applied over low-k dielectric layer 48 and extends into trenches 52A and 52B. Photo resist 56 is patterned in a lithography process. The respective step is shown as step 212 in the process flow shown in FIG. 12. Next, as shown in FIG. 6, low-k dielectric layers 44 and 42 are etched using the patterned photo resist 56 as an etching mask, and hence via opening 58 is formed. The respective step is shown as step 214 in the process flow shown in FIG. 12. Etch stop layer 40 is then etched, exposing the underlying conductive material such as metal cap 38. In a subsequent step, photo resist 56 is removed, for example, in an ashing step, resulting in the structure shown in FIG. 7.

Figure 8:
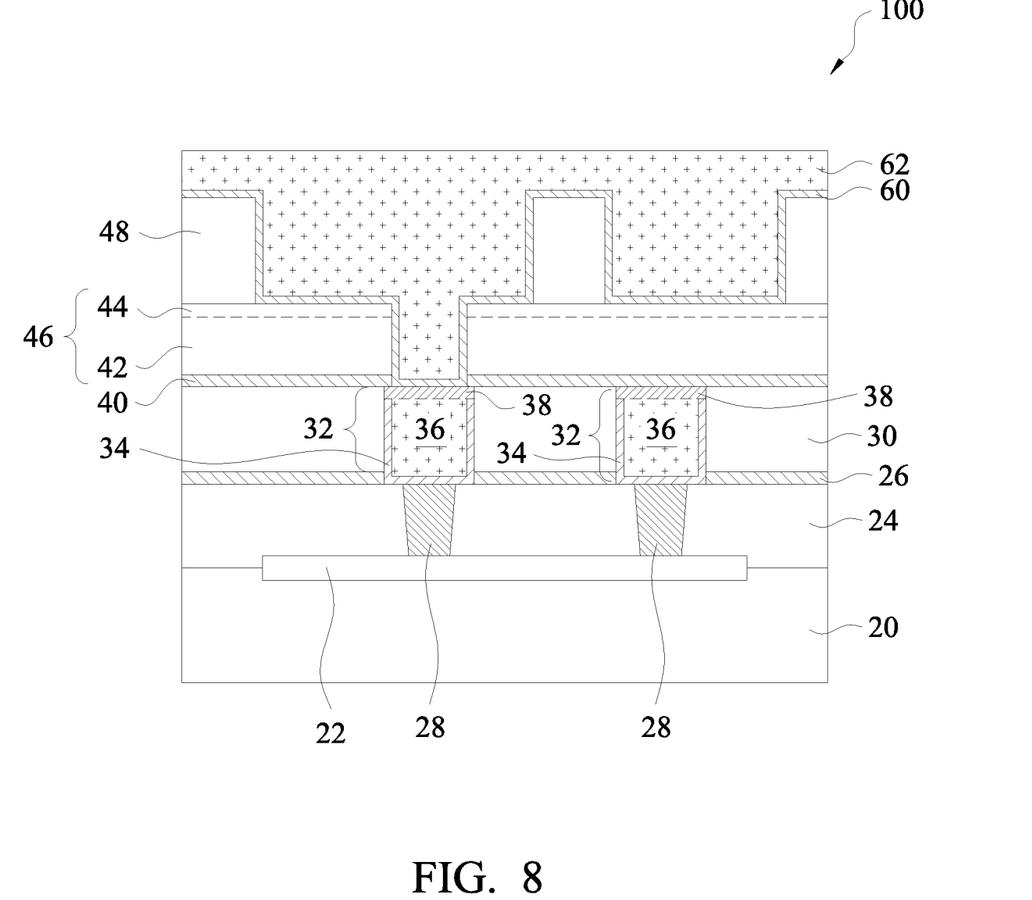
Figure 9:
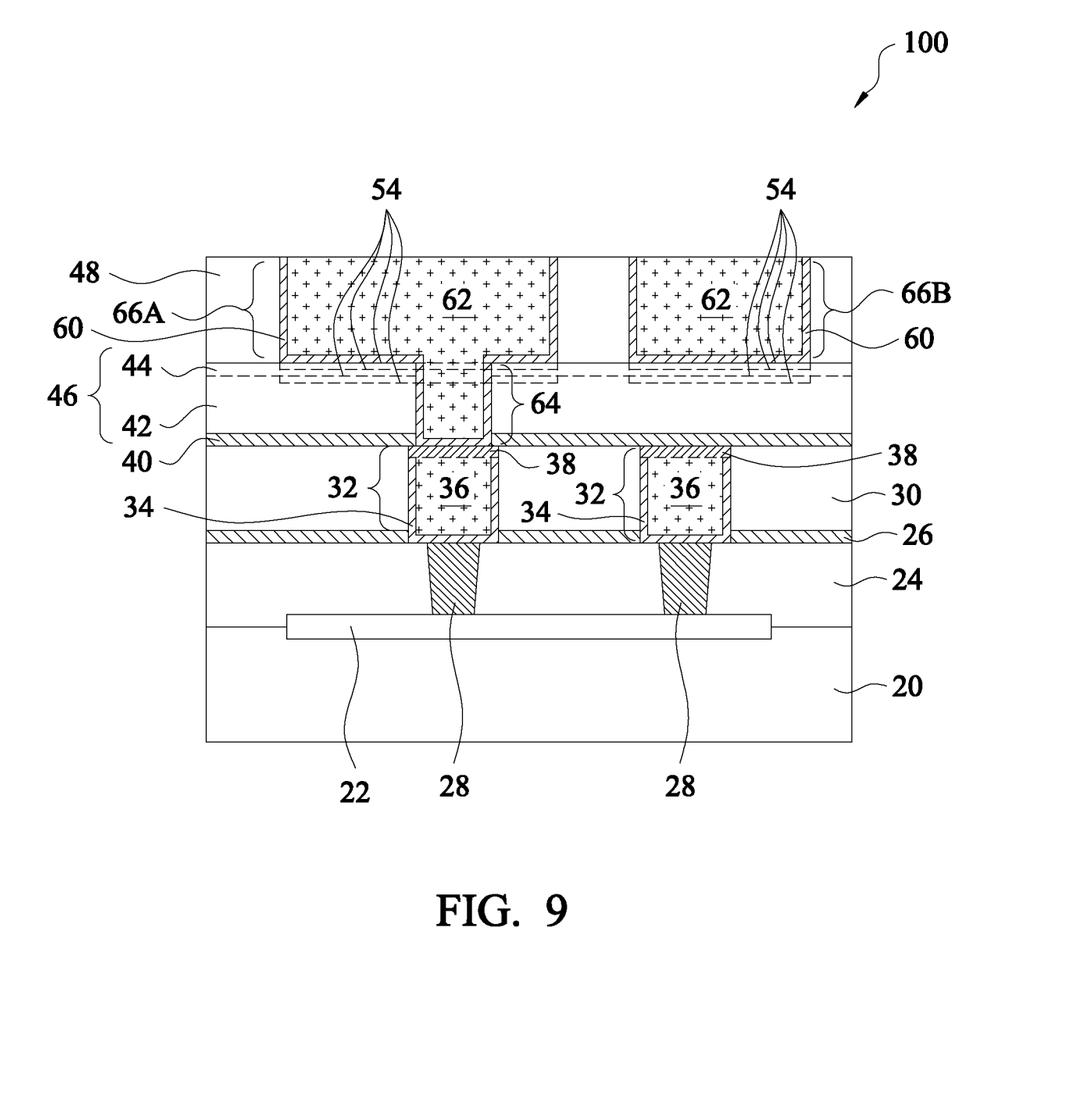

FIGS. 8 and 9 illustrate the formation of via 64 and conductive lines 66 (including 66A and 66B). The respective step is shown as step 216 in the process flow shown in FIG. 12. Referring to FIG. 8, diffusion barrier layer 60 is deposited, and copper-containing material 62 is formed over diffusion barrier layer 60. Diffusion barrier layers 60 may include titanium, titanium nitride, tantalum, tantalum nitride, or the like. Copper-containing material 62 may include copper or a copper alloy.

In a subsequent step, as shown in FIG. 9, a planarization such as CMP is performed to remove excess portions of diffusion barrier layer 60 and copper-containing material 62. The remaining portions of diffusion barrier layer 60 and copper-containing material 62 form via 64 and metal lines 66A and 66B. The bottom surfaces of metal lines 66A and 66B may be at one of several possible levels, for example, substantially level with the top surface of transition low-k dielectric layer 44. Alternatively, the bottom surfaces of metal lines 66A and 66B may be between the top surface and bottom surface of transition low-k dielectric layer 44, at the top surface of low-k dielectric layer 42, or extend into low-k dielectric layer 42, as illustrated by dashed lines 54.

Figure 10:
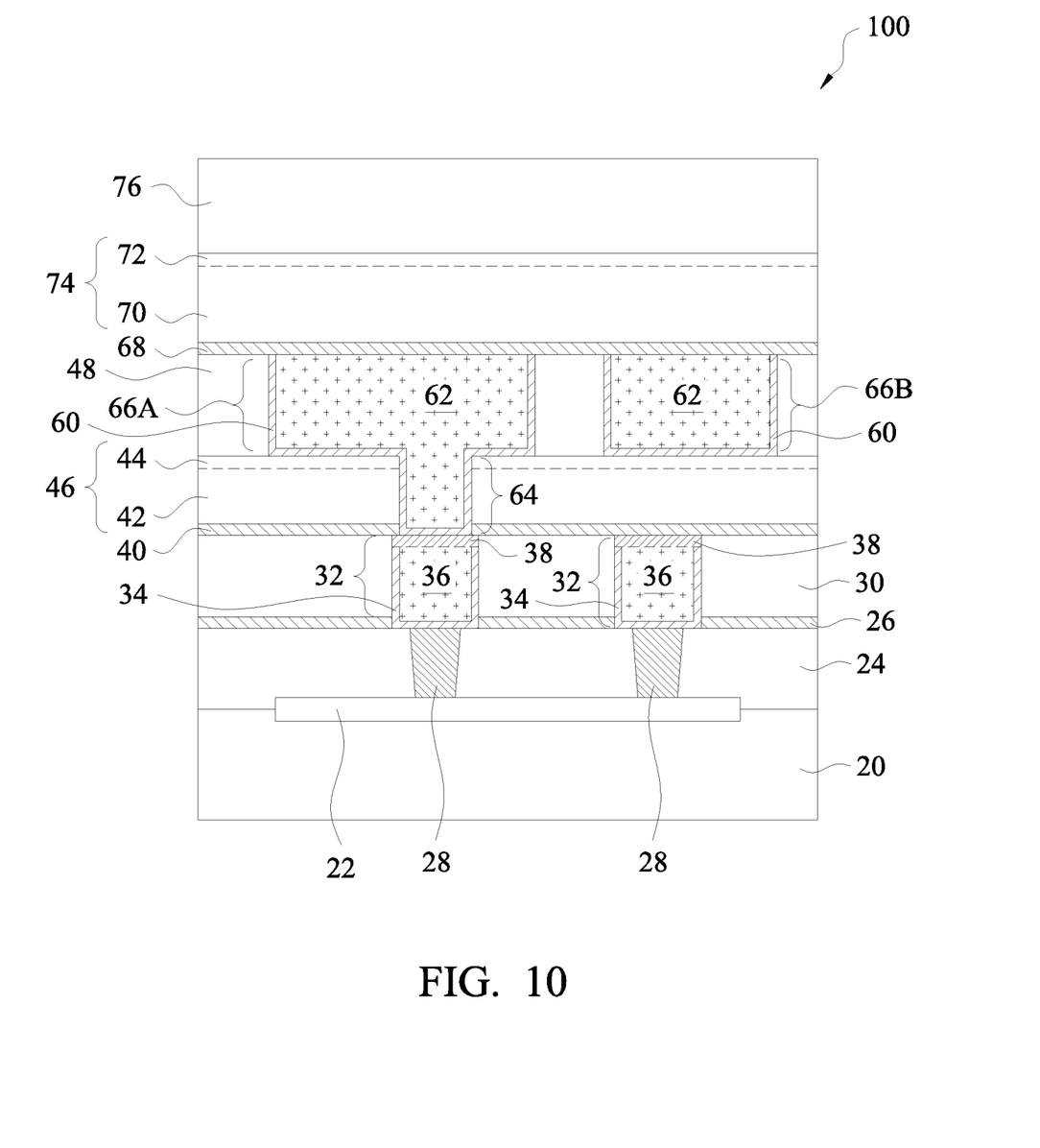
Figure 11:
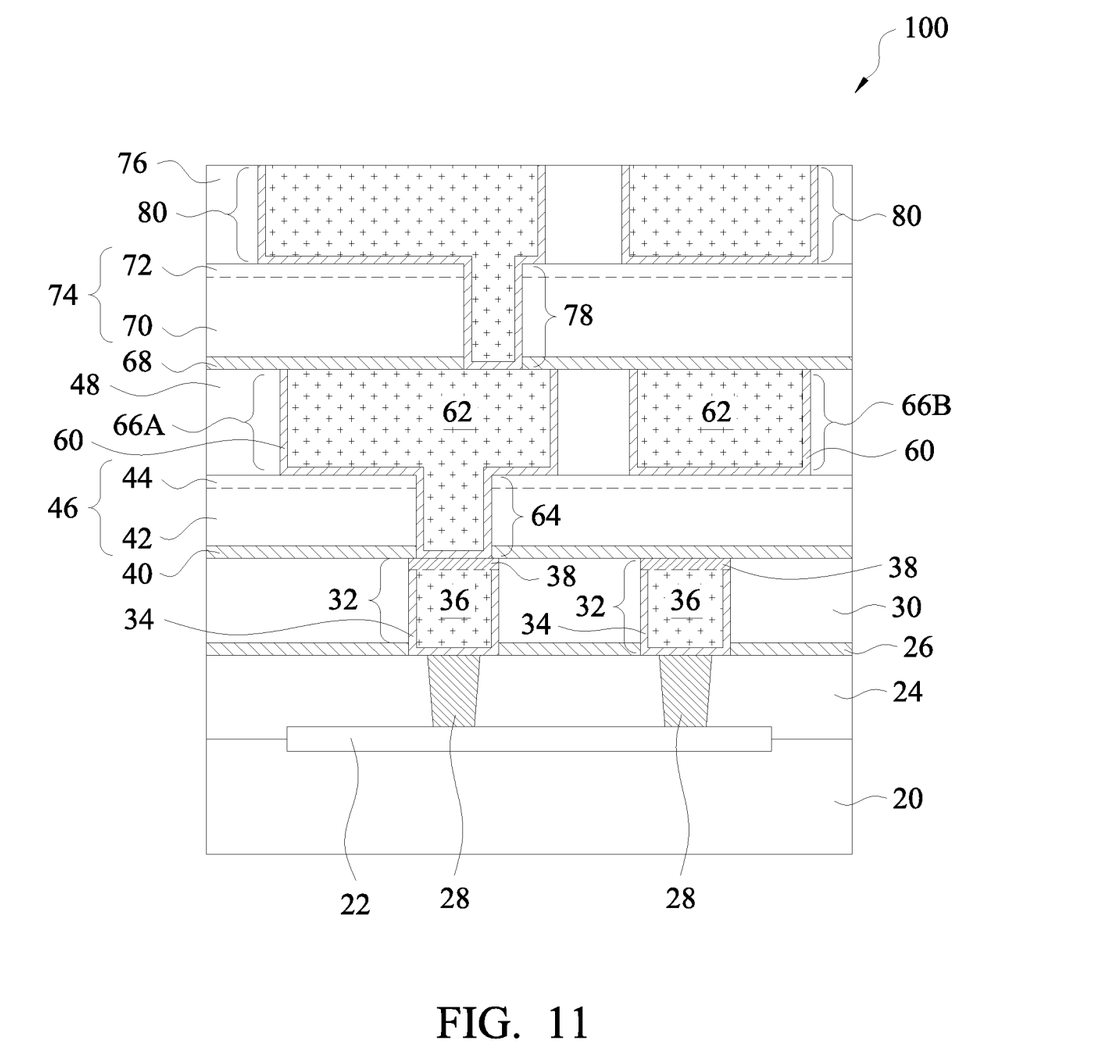
Figure 12:
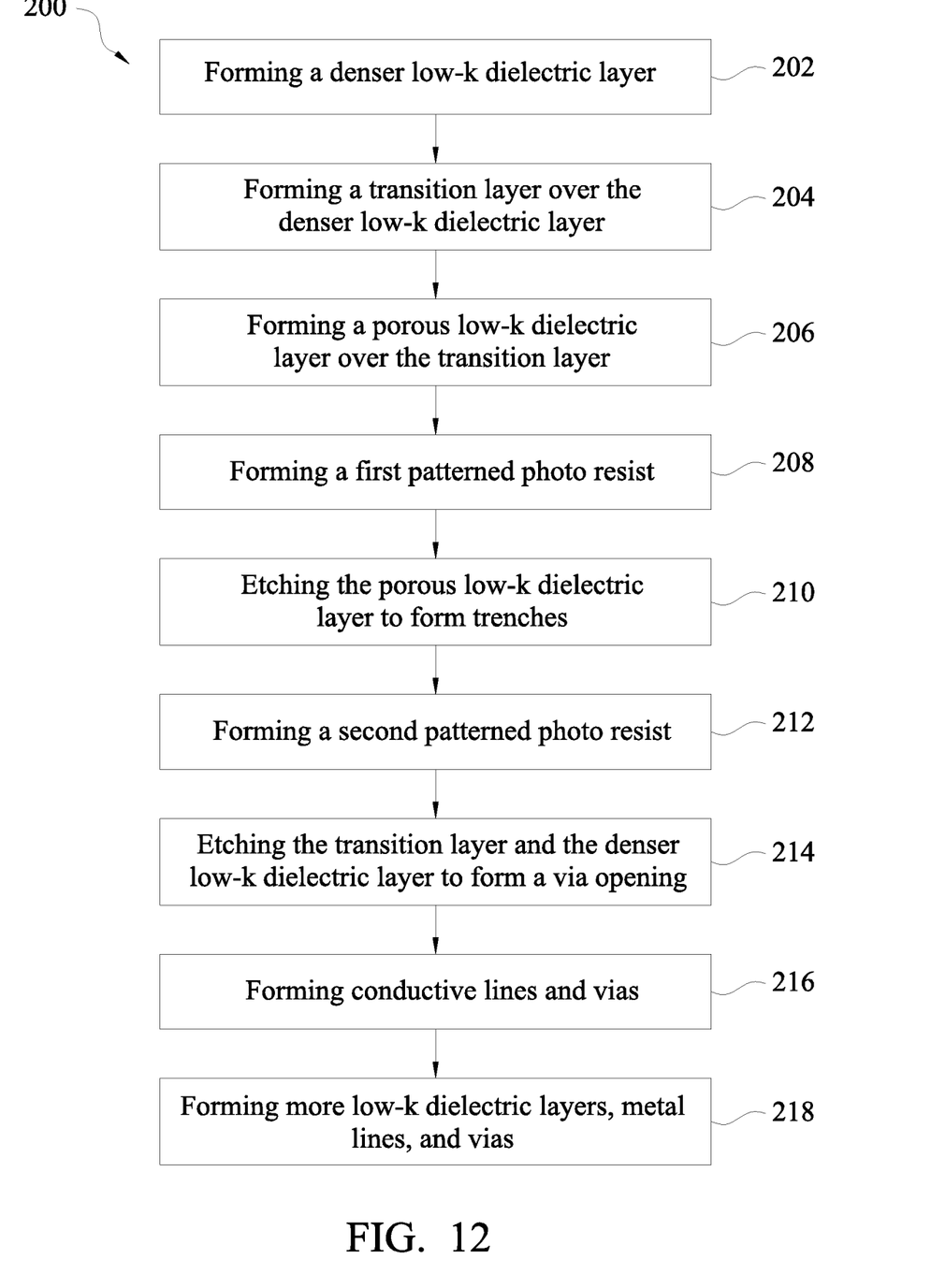
FIG. 12 illustrates a process flow for forming an interconnect structure in accordance with some embodiments.

FIGS. 10 and 11 illustrate the formation of additional low-k dielectric layers, metal lines, and vias over low-k dielectric layer 48. The respective step is shown as step 218 in the process flow shown in FIG. 12. For example, as shown in FIG. 10, etch stop layer 68 is deposited, followed by the formation of low-k dielectric layers 70, 72 (or layer 74), and 76. The materials, properties, and the formation processes of layers 68, 70, 72, and 76 may be essentially the same as that of layers 40, 42, 44, and 48, respectively, and hence the details are not repeated herein. In subsequent steps, as shown in FIG. 11, via 78 and metal lines 80 are formed, similar to the formation of via 64 and metal lines 66, respectively.

In accordance with some embodiments, low-k dielectric layer 72, which is a transition layer, is formed between denser low-k dielectric layer 70 and more porous low-k dielectric layer 76. In accordance with alternative embodiments, low-k dielectric layer 72 is not formed, and porous low-k dielectric layer 76 contacts denser low-k dielectric layer 70 directly.

Figure 13:
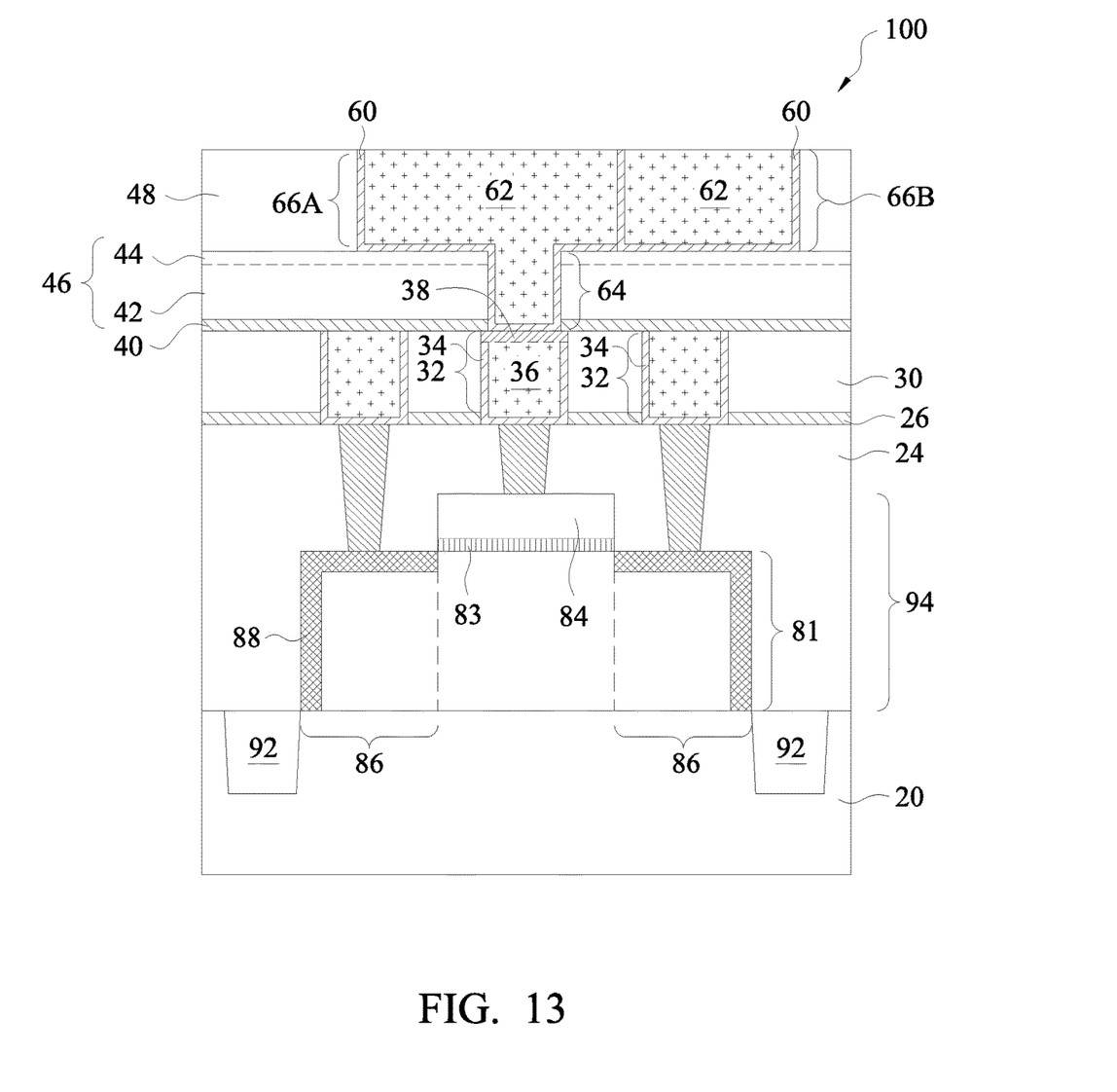
FIG. 13 illustrates a FinFET underlying the interconnect structure in accordance with some embodiments.

The dual damascene structures in accordance with some embodiments of the present disclosure may be formed over, and electrically coupled to, various types of devices including, and not limited to, planar Field-Effect Transistors (FETs), Fin Field-Effect Transistors (FinFETs), resistors, capacitors, and the like. For example, FIG. 13 illustrates a cross-sectional view illustrating that dielectric layers 46, in which via 64 is located, is formed over FinFET 94, which is a part of integrated circuit devices 22 as shown in FIG. 11.

In accordance with some embodiments of the present disclosure, FinFET 78 includes semiconductor fin 81, gate dielectric 83, and gate electrode 84. Semiconductor fin 81 is over top surfaces of adjacent Shallow Trench Isolation (STI) regions 92. STI regions 92 may also include some portions (un-illustrated) forming a ring with the illustrated portions. The un-illustrated portions are not in the same plane as the illustrated portions, and are not illustrated since they are not in the same plane as the illustrated portion of semiconductor fin 81.

Gate dielectric 83 and gate electrode 84 are on the sidewalls and a top surface of a middle portion of gate dielectric 83 and gate electrode 84. Source and drain regions 86 are on the opposite sides of gate dielectric 83 and gate electrode 84. Source/drain silicide regions 88 are on the surfaces of source and drain region 86. Contact plugs 28 are formed to connect to source/drain silicide regions 88, and to electrically couple to gate electrode 84.

Figure 7:
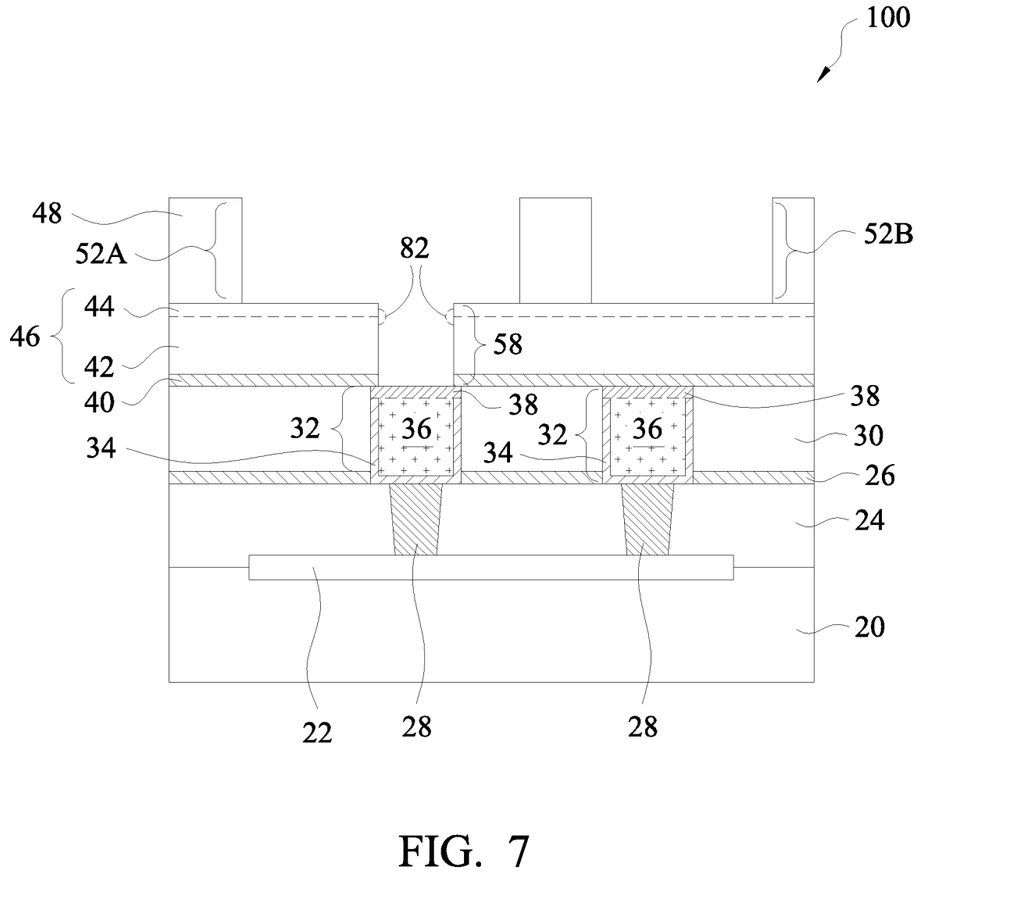

The embodiments of the present disclosure have some advantageous features. By forming a dense low-k layer that is denser than the overlying more porous low-k dielectric layer, the distortion of vias is eliminated or reduced. For example, FIG. 7 illustrates an exemplary distortion, wherein lines 82 represent the sidewalls of via opening 58 when the distortion occurs. It is observed that when the distortion occurs, an upper portion of the via opening may be narrower than the overlying portion and the underlying portion. The distortion results in the difficulty in the formation of diffusion barrier layer (such as 60 in FIG. 8), and it is difficult to form a diffusion barrier layer having a uniform thickness. Experiments indicated that by forming a denser low-k dielectric layer underlying a more porous low-k dielectric layer, and by allowing the portion of via that is likely to have the distortion located in the top portion of the denser low-k dielectric layer, the distortion may be eliminated or at least reduced.

In accordance with some embodiments of the present disclosure, an integrated circuit structure includes a first low-k dielectric layer having a first k value, and a second low-k dielectric layer having a second k value lower than the first k value. The second low-k dielectric layer is overlying the first low-k dielectric layer. A dual damascene structure includes a via with a portion in the first low-k dielectric layer, and a metal line over and joined to the via. The metal line includes a portion in the second low-k dielectric layer.

In accordance with some embodiments of the present disclosure, an integrated circuit structure includes a first low-k dielectric layer having a first k value, a transition layer overlying and contacting the first low-k dielectric layer, and a second low-k dielectric layer overlying and contacting the transition layer. The transition layer has a second k value lower than the first k value. The second low-k dielectric layer has a third k value lower than the second k value. A dual damascene structure includes a via having a portion in the first low-k dielectric layer, and a metal line over and joined to the via, wherein the metal line extends from a top surface to a bottom surface of the second low-k dielectric layer.

In accordance with some embodiments of the present disclosure, a method includes depositing a first low-k dielectric layer having a first k value, depositing a transition layer overlying and contacting the first low-k dielectric layer, and depositing a second low-k dielectric layer overlying and contacting the transition layer. The transition layer has a second k value lower than the first k value. The second low-k dielectric layer has a third k value lower than the second k value. The method further includes performing a first etching step to etch the second low-k dielectric layer until the transition layer is exposed to form a trench, performing a second etching step to form a via opening underlying and joined to the trench, with the first low-k dielectric layer etched, and filling the trench and the via to form a metal line in the trench and a via in the via opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit structure comprising:
   a plurality of dielectric layers, and wherein the plurality of dielectric layers comprises:
   a bottommost layer having a first k value;
   a transition layer overlying the bottommost layer, the transition layer having a second k value lower than the first k value,
   wherein the transition layer comprises a plurality of sub-layers, each having a uniform k value, wherein upper layers in the plurality of sub-layers have k values lower than k values of respective lower layers in the plurality of sub-layers; and
   a topmost layer overlying the transition layer, the topmost layer having a third k value lower than the second k value; and
   a conductive feature comprising:
   a via extending into the bottommost layer in the plurality of dielectric layers; and
   a metal line extending into a topmost layer in the plurality of dielectric layers.

2. The integrated circuit structure of claim 1, wherein the metal line further extends into both of the transition layer and the bottommost layer.

3. The integrated circuit structure of claim 1, wherein at an interface between the transition layer and the topmost layer, there is an abrupt difference in k values of the transition layer and the topmost layer.

4. The integrated circuit structure of claim 1 further comprising:
   an additional dielectric layer underlying the plurality of dielectric layers; and
   an additional etch stop layer between, and in contact with, the bottommost layer and the plurality of dielectric layers, wherein the via further extends into the additional etch stop layer.

5. The integrated circuit structure of claim 4 further comprising an additional metal line in the additional dielectric layer, wherein the via contacts a top surface of the additional metal line.

6. The integrated circuit structure of claim 1, wherein each of the plurality of dielectric layers comprises silicon, oxygen, and carbon.

7. The integrated circuit structure of claim 1, wherein the plurality of dielectric layers have same atomic percentages of silicon, oxygen, and carbon, and wherein the plurality of dielectric layers have different porosity values.

8. The integrated circuit structure of claim 1, wherein the via and the metal line form a dual damascene structure.

9. An integrated circuit structure comprising:
   a plurality of dielectric layers, each having a uniform dielectric constant (k value), wherein from a bottommost layer in the plurality of dielectric layers to a topmost layer in the plurality of dielectric layers, k values of the plurality of dielectric layers are increasingly lower; and
   a dual damascene structure comprising:
   a via extending into the bottommost layer in the plurality of dielectric layers; and
   a metal line over and joining to the via, wherein the metal line extends into both of the topmost layer and the bottommost layer in the plurality of dielectric layers.

10. The integrated circuit structure of claim 9, wherein the plurality of dielectric layers comprises the bottommost layer, a transition layer over the bottommost layer, and the topmost layer over the transition layer.

11. The integrated circuit structure of claim 10, wherein differences between k values of neighboring layers in the bottommost layer, the transition layer, and the topmost layer are in a range between about 0.1 and about 0.3.

12. The integrated circuit structure of claim 10, wherein the transition layer is thinner than both of the bottommost layer and the topmost layer.

13. The integrated circuit structure of claim 10, wherein each of the plurality of dielectric layers comprises silicon, oxygen, and carbon.

14. The integrated circuit structure of claim 13, wherein the plurality of dielectric layers have same atomic percentages of silicon, oxygen, and carbon, and the plurality of dielectric layers have different porosity values.

15. An integrated circuit structure comprising:
   a first dielectric layer having a first k value;
   a transition layer overlying the first dielectric layer, wherein the transition layer has a second k value lower than the first k value, and wherein the second k value is substantially uniform in the transition layer;
   a second dielectric layer overlying the transition layer, the second dielectric layer having a third k value lower than the second k value; and a dual damascene structure comprising:
  a via in the first dielectric layer; and
  a metal line extending into each of the second dielectric layer, the transition layer, and the first dielectric layer.

16. The integrated circuit structure of claim 15, wherein the transition layer comprises a plurality of sub-layers, each having a k value different from k values in other ones of the plurality of sub-layers, and wherein the k value in each of the plurality of sub-layers is substantially uniform.

17. The integrated circuit structure of claim 15, wherein the transition layer is thinner than both of the first dielectric layer and the second dielectric layer.

18. The integrated circuit structure of claim 15, wherein at an interface between the transition layer and the second dielectric layer, there is an abrupt difference in k values of the transition layer and the second dielectric layer.

19. The integrated circuit structure of claim 15, wherein the second k value is lower than the first k value by a first difference, and the third k value is lower than the second k value by a second difference, and wherein the first difference is greater than the second difference.

20. The integrated circuit structure of claim 15 further comprising an additional dielectric layer physically contacting a first top surface of the metal line and a second top surface of the second dielectric layer.

* * * * *